(12) United States Patent
Solihin

(10) Patent No.: US 9,501,350 B2
(45) Date of Patent: Nov. 22, 2016

(54) DETECTING UNIDIRECTIONAL RESISTANCE DRIFT ERRORS IN A MULTILEVEL CELL OF A PHASE CHANGE MEMORY

(71) Applicant: Empire Technology Development LLC, Wilmington, DE (US)

(72) Inventor: Yan Solihin, Raleigh, NC (US)

(73) Assignee: Empire Technology Development LLC, Wilmington, DE (US)

( * ) Notice: Subject to any disclaimer, the term of this patent is extended or adjusted under 35 U.S.C. 154(b) by 47 days.

(21) Appl. No.: 14/492,186

(22) Filed: Sep. 22, 2014

(65) Prior Publication Data
US 2016/0085617 A1    Mar. 24, 2016

(51) Int. Cl.
*G06F 11/10* (2006.01)
*G06F 3/06* (2006.01)
*G06F 11/34* (2006.01)

(52) U.S. Cl.
CPC .......... *G06F 11/1004* (2013.01); *G06F 3/064* (2013.01); *G06F 3/0619* (2013.01); *G06F 3/0679* (2013.01)

(58) Field of Classification Search
CPC .. G06F 11/1004; G06F 3/0619; G06F 3/064; G06F 3/0679
See application file for complete search history.

(56) References Cited

U.S. PATENT DOCUMENTS

| | | | |
|---|---|---|---|
| 5,128,947 A * | 7/1992 | Corrigan | G11C 29/74 714/816 |
| 5,754,753 A * | 5/1998 | Smelser | G06F 11/1012 714/6.13 |
| 5,859,858 A * | 1/1999 | Leeman | G06F 11/1072 714/721 |
| 8,482,977 B2 | 7/2013 | Kim et al. | |
| 2008/0163032 A1* | 7/2008 | Lastras-Montano | G06F 11/1044 714/785 |
| 2010/0177564 A1* | 7/2010 | Feeley | G06F 11/1068 365/185.09 |
| 2010/0214811 A1* | 8/2010 | Franceschini | G11C 15/046 365/49.17 |
| 2012/0292584 A1* | 11/2012 | Rocklein | H01L 45/08 257/2 |
| 2013/0100726 A1* | 4/2013 | Yi | G11C 11/5685 365/148 |

OTHER PUBLICATIONS

Awasthi, M. et al., "Efficient Scrub Mechanisms for Error-Prone Emerging Memories," Proceedings of the IEEE 18th International Symposium on High-Performance Computer Architecture, 2012, pp. 1-12.

(Continued)

*Primary Examiner* — Cynthia Britt
*Assistant Examiner* — Dipakkumar Gandhi
(74) *Attorney, Agent, or Firm* — Turk IP Law, LLC

(57) ABSTRACT

Technologies are generally described herein to detect unidirectional resistance drift errors in a multilevel cell of a phase change memory. The resistance levels of the multilevel cell of the phase change memory may be encoded to detect unidirectional resistance drift errors. In some examples, Berger Code-compatible encoding may be used. When a word is written to the multilevel cell, a write check code may be generated. The write check code may be a binary representation of the number of zeroes contained in the word as written. When the word is read from the multilevel cell, a read check code may be generated. The read check code may be a binary representation of the number of zeroes contained in the word as read. An error can be detected if a comparison indicates that the write check code and the read check code are different.

15 Claims, 7 Drawing Sheets

(56) References Cited

OTHER PUBLICATIONS

Jiang, A. A. et al., "Patterned Cells for Phase Change Memories," IEEE International Symposium on Information Theory Proceedings (ISIT), Jul. 31, 2011-Aug. 5, 2011, pp. 2333-2337.

Madalin, N. et al., "Unidiectional Error Detection, Localization and Correction for DRAMs: Application to On-Line DRAM Repair Strategies," Proceedings of the IEEE 17th International On-Line Testing Symposium, 2011, pp. 264-269.

Piestrak, S. J. et al. "On Designing Efficient Codecs for Bus-Invert Berger Code for Fully Asymmetric Communication," IEEE Transactions on Circuits and Systems II: Express Briefs, vol. 57, No. 10, Oct. 2010, pp. 777-781.

Qureshi, M. K. et al., "Improving read performance of Phase Change Memories via Write Cancellation and Write Pausing," IEEE 16th International Symposium on High Performance Computer Architecture (HPCA), Jan. 9-14, 2010, pp. 1-11.

Seong, N. H. et al., "Tri-Level-Cell Phase Change Memory: Toward an Efficient and Reliable Memory System," Proceedings of the 40th Annual International Symposium on Computer Architecture, Jun. 2013, pp. 440-451.

Xu, W. and Zhang, T., "A Time-Aware Fault Tolerance Scheme to Improve Reliability of Multilevel Phase-Change Memory in the Presence of Significant Resistance Drift," IEEE Transactions on Very Large Scale Integration (VLSI) Systems, vol. 19, No. 8, Aug. 2011, pp. 1357-1367.

* cited by examiner

DETECTING UNIDIRECTIONAL RESISTANCE DRIFT ERRORS IN A MULTILEVEL CELL OF A PHASE CHANGE MEMORY

BACKGROUND

Unless otherwise indicated herein, the materials described in this section are not prior art to the claims of this application and are not admitted to be prior art by inclusion in this section.

Phase-change memory or phase-change random access memory (PCM or PRAM) is a non-volatile random access memory that has moved from research prototypes to commercial products. A PRAM cell may be constructed from germanium-antimony-tellurium (GST) material that may have a high melting point (approximately 620 Celsius). A PRAM cell may have various crystallization states (phases). In one phase, the GST material may be amorphous, resulting in a relatively high resistance value. In another phase, the GST material may be substantially crystalline, resulting in a relatively low resistance value.

For example, in a multilevel cell (MLC) PRAM having two resistance levels (e.g., a "2-level PRAM"), the low resistance value may be associated with logical "0," whereas a high resistance value may be associated with a logical "1." If a logical "1" is to be written to the 2-level PRAM, the PRAM cell may be configured to the amorphous state. If a logical "0" is to be written to the 2-level PRAM, the PRAM cell may be configured to the crystalline state, which has a relatively lower resistance level as compared to the amorphous state. When reading information from the PRAM cell, the resistance level may be measured to determine the information written to the PRAM cell.

PRAMs can be vulnerable to resistance drifts which may cause errors when performing a read operation on a PRAM. A resistance drift may be in the form of a change in resistance level over time caused by changes in the GST material. The resistance drift can cause an erroneous condition in which the information stored in the MLC PRAM may be different than what is read due to the change in resistance level. In some applications, the resistance drift can be a significant issue. In some instances, a 4-level MLC PRAM with soft error rate of $6.74 \times 10^{-5}$ can incur $9.26 \times 10^6$ errors, for example, which is nearly one million times larger than that of dynamic RAM (DRAM).

SUMMARY

In one example, a method to detect unidirectional errors in a phase change memory is described. The method may include encoding a plurality of multilevel memory cells in a memory according to a unidirectional error detection encoding scheme, writing a word to the memory, and computing a write check code for the word as written to the memory. The method may further include reading the word from the memory and computing a read check code for the word as read from the memory. The method may additionally include comparing the write check code computed for the word as written to the memory to the read check code computed for the word as read from the memory, and outputting an error indication if the write check code is not equal to the read check code computed for the word as read from the memory.

In another example, a memory device is described. The memory device may include a plurality of multilevel memory cells encoded according to a unidirectional error detection encoding scheme, an error correction code generator coupled to the plurality of multilevel memory cells, and a comparator coupled to the error correction code generator. The error correction code generative may be operative to generate a write check code for data as written into at least one of the plurality of multilevel memory cells, and generate a read check code for the data as read from the at least one of the plurality of multilevel memory cells. The comparator may be operative compare the write check code generated by the error detection code generator to the read check code generated by the error detection code generator. The comparator may also output an error indication if the write check code generated by the error detection code generator and the read check code generated by the error detection code generator are different.

In a further example, a computer-readable storage medium is described. The computer-readable storage medium comprises computer-executable instructions stored thereon which, in response to execution by a computer, cause the computer to perform one or more methods described herein.

In a still further example, a system is described. The system may include a bus, a central processing unit coupled to the bus, and a memory controller coupled to the bus. The memory controller may be operative to control an error detection code generator. The error detection code generator may be configured to receive an input from the central processing unit via the bus that a word has been written to a multilevel cell of a phase change memory. The phase change memory may be encoded in Berger code-compatible scheme. The error detection code generator may be further configured to compute a write check code for the word as written to the multilevel cell of the phase change memory. The error detection code generator may also be configured to receive an input from the central processing unit via the bus that the word has been read from the multilevel cell of the phase change memory, compute a read check code for the word as read from the multilevel cell of the phase change memory, and compare the write check code to the read check code. Based on the result of the comparison, the error detection code generator may be additionally configured to output an error indication if the write check code is different from the read check code.

The foregoing Summary is illustrative only and is not intended to be in any way limiting. In addition to the illustrative aspects, embodiments, and features described above, further aspects, embodiments, and features will become apparent by reference to the Figures and the following Detailed Description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
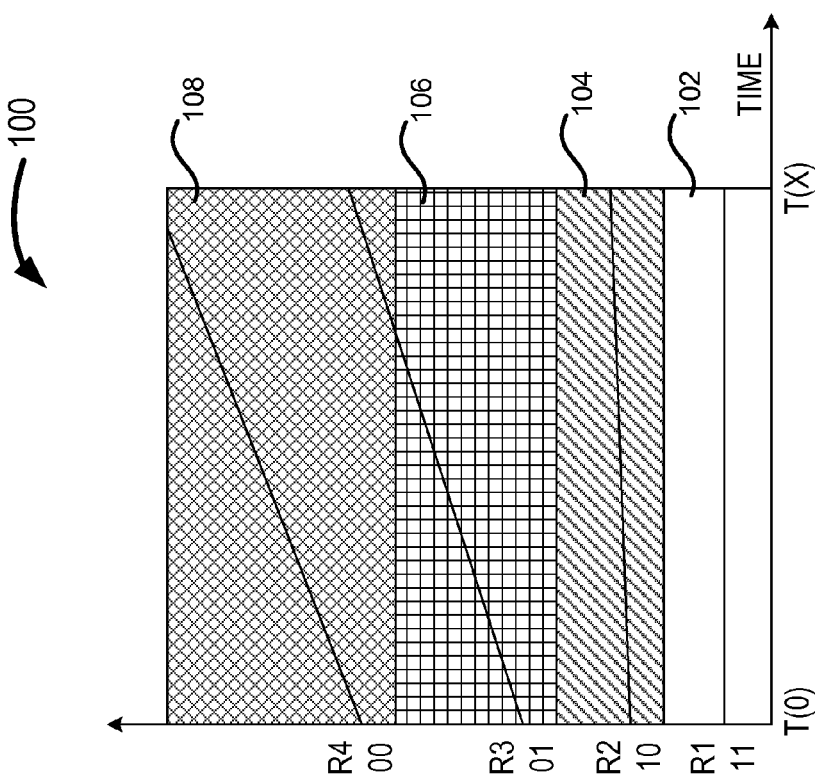
FIG. 1 is an illustration of a multilevel cell PRAM with an example resistance drift.

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein.

The aspects of the present disclosure, as generally described herein, and illustrated in the figures, can be arranged, substituted, combined, separated, and designed in a wide variety of different configurations, all of which are explicitly contemplated herein. Further, one or more components of various figures described below may not be included in the figure, for purposes of clarity or brevity. This should not be construed as a disclaimer or admission that the non-included components do not form part of the subject matter described herein. Additionally, one or more figures may use a "dashed" line as a border to visually encapsulate one or more components. Unless specifically described otherwise, the use of a dashed line is for purposes of illustration and does not reflect functional or physical boundaries.

This disclosure is generally drawn, inter alia, to technologies usable to detect errors, such as unidirectional errors in a phase change memory that may be caused by a resistance drift of a resistance level in a multilevel cell (MLC) phase change random access memory (PRAM) or in other types of phase change memory (PCM). Some aspects of the presently disclosed subject matter may use a unidirectional error detection encoding scheme for different resistance levels of the MLC PRAM. In some examples, a unidirectional error detection check code may be calculated for a word when written to and when read from MLC PRAM. The check codes may be compared and an indication of an error may be outputted if the check codes are different.

In a PRAM, the magnitude of the resistance drift is may be dependent on the particular resistance level that is drifting. For a cell that initially has a resistance level R, at time t, its resistance after drift may be calculated using Equation (1):

$$R_{drift}(t) = R \times \left(\frac{t}{t_0}\right)^\alpha \qquad \text{Equation (1)}$$

where "α" may be a drift exponent that determines how fast the resistance increases. Both R and $t_0$ may be constants that denote the initial resistance level (R) at the time of programming ($t_0$).

The value of the drift component α may increase as the resistance level increases. For example, the drift component α can be ten times greater at the highest resistance level of a MLC PRAM as compared to the lowest resistance level. For a MLC PRAM, the resistance levels chosen may be typically exponentially larger. For instance the second lowest resistance level may be higher by 10× compared to the lowest resistance level, while the third lowest resistance level may be higher by 100× compared to the lowest resistance level, and so forth.

Equation (1) indicates that as time progresses, the resistance in a particular resistance level may tend to increase. Equation (1) also illustrates that the resistance drift in a particular resistance level may increase at a faster rate at the higher resistance levels (due to significantly larger R and α). Each of the resistance levels may experience different degrees of resistance drifts. FIG. 1 illustrates an example of this phenomenon.

FIG. 1 is an illustration of a multilevel cell PRAM 100 with an example resistance drift arranged according to at least some embodiments presented herein. The MLC PRAM 100 in this example has four relative resistance levels: a low resistance level 102 with a resistance R1; a mid-low resistance level 104 with a resistance R2; a mid-high resistance level 106 with a resistance R3; and a high resistance level 108 with a resistance R4. FIG. 1 uses an example encoding where the resistance levels from the highest to the lowest are respectively represented by bit values 00, 01, 10, and 11.

The behavior illustrated in FIG. 1 and placed into mathematical form in Equation 1 may indicate that the higher the initial resistance level, the faster resistance drift may occur, and at a greater amount. As shown in FIG. 1, the low resistance level 102 may not indicate any resistance drift, as resistance R1 may be relatively constant from T(0) to T(X). The mid-low resistance level 104 may have some amount of resistance drift, indicated by the resistance of R2 being slightly less at T(0) than at T(X).

The mid-high resistance level 106 may have a greater amount of resistance drift than the mid-low resistance level 104. As shown, the resistance R3 of the mid-high resistance level 106 at time T(X) may be a resistance level assigned to high resistance level 108. The high resistance level 108, though showing resistance drift, may not be affected by the resistance drift because there is no higher resistance level above the high resistance level 108. Because of the possibility of resistance drift from one resistance level to a higher (or other) resistance level, in the MLC PRAM 100 of FIG. 1, the most vulnerable resistance levels may be the mid-low resistance level 104 and the mid-high resistance level 106.

As shown in FIG. 1, resistance drift may increase over time, but may not decrease. According to some examples, a unidirectional error detection structure may be used to detect errors possibly caused by resistance drift. In some examples of a Berger Code may be used as a unidirectional error detection structure. Berger Code may be used by counting the number of zeroes in an information word, and encoding the count in a binary format as a check code. Berger Code may detect any number of unidirectional errors. The storage overhead for Berger Code for an N-bit information code may be $\log_2(N)+1$ bits for the check code. The larger the value of N, the smaller the overheads may be relative to the size of the information word.

Table 1 shows examples of the relative overheads of the check code vs. the information code for different value of N bits.

TABLE 1

Storage overheads for Berger Code for various information size.

| Information word size (Bits) | Size of Check Code (bits) | Ratio of Check Code to Information |
|---|---|---|
| 8 | 4 | 50% |
| 16 | 5 | 31.3% |
| 32 | 6 | 18.8% |
| 64 | 7 | 10.9% |
| 128 | 8 | 6.3% |
| 256 | 9 | 3.5% |
| 512 | 10 | 2.0% |
| 1024 | 11 | 1.1% |
| 2048 | 12 | 0.6% |
| 4096 | 13 | 0.3% |
| 8192 | 14 | 0.2% |

Table 1 shows that with as few as 256 bits (32 bytes), the space overhead using a Berger Code error detection scheme may reach less than 5%. Above 2048 bits (256 bytes), the space overhead may become negligibly small (less than 1%).

Figure 2:
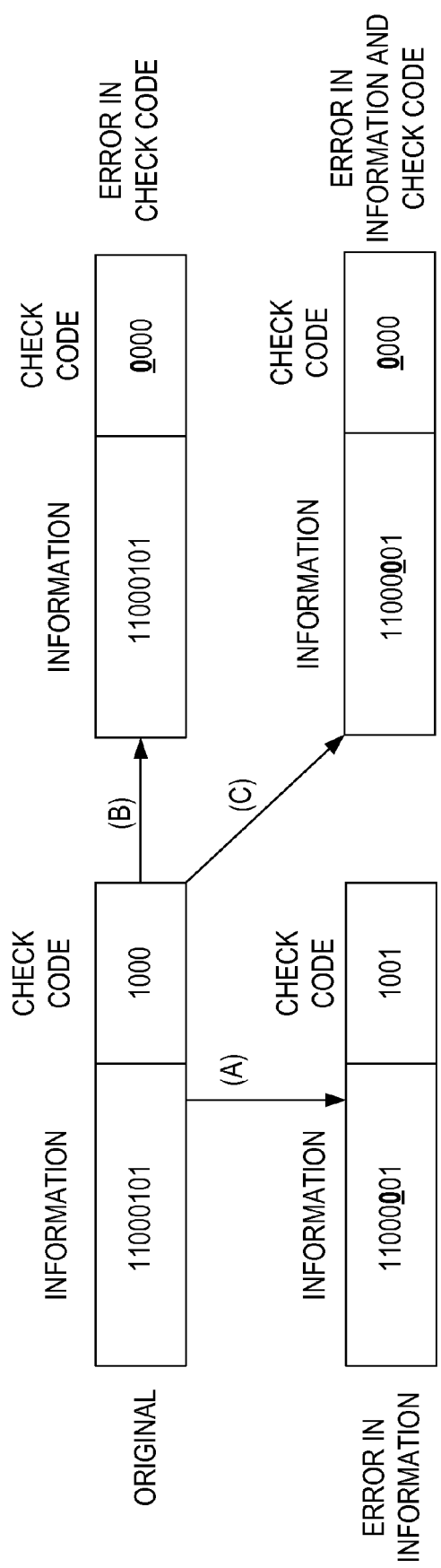
FIG. 2 is an illustration that displays the use of a unidirectional error detection structure that is based on a Berger Code.

FIG. 2 is an illustration that displays the use of a unidirectional error detection structure that is based on a Berger Code arranged according to at least some embodiments presented herein. The use of Berger Code as a check code in binary form may be used to detect unidirectional errors. In FIG. 2, the "Original" information may be a word having an example value, "11000101". In some examples, the unidirectional error detection structure may sum the number of zeroes in the Original information, resulting in a Berger Code check code, in binary representation, for the decimal "4" as "1000".

In the situation illustrated as (A) in FIG. 2, the word "11000101" in the Original information has transformed into "11000001." The 6th bit from the left has transformed from a logical "1" to a logical "0". The Berger Code check code binary representation for situation (A) has five zeroes, resulting in a check code of "1001." A comparison of the check code in the Original and the check code in situation (A) would indicate an error because of the difference between the check codes.

In the situation illustrated as (B), the word "11000101" in the Original information has been maintained, but the check code has transformed from "1000" in the Original to "0000" in situation (B). A comparison of the Original check code and the check code in situation (B) indicates an error. In the situation illustrated as (C), the word "11000101" in the Original information has transformed into "11000001" and the check code has transformed from "1000" in the Original to "0000" in situation (C). A comparison of the Original check code and the check code in situation (C) indicates an error.

Figure 3:
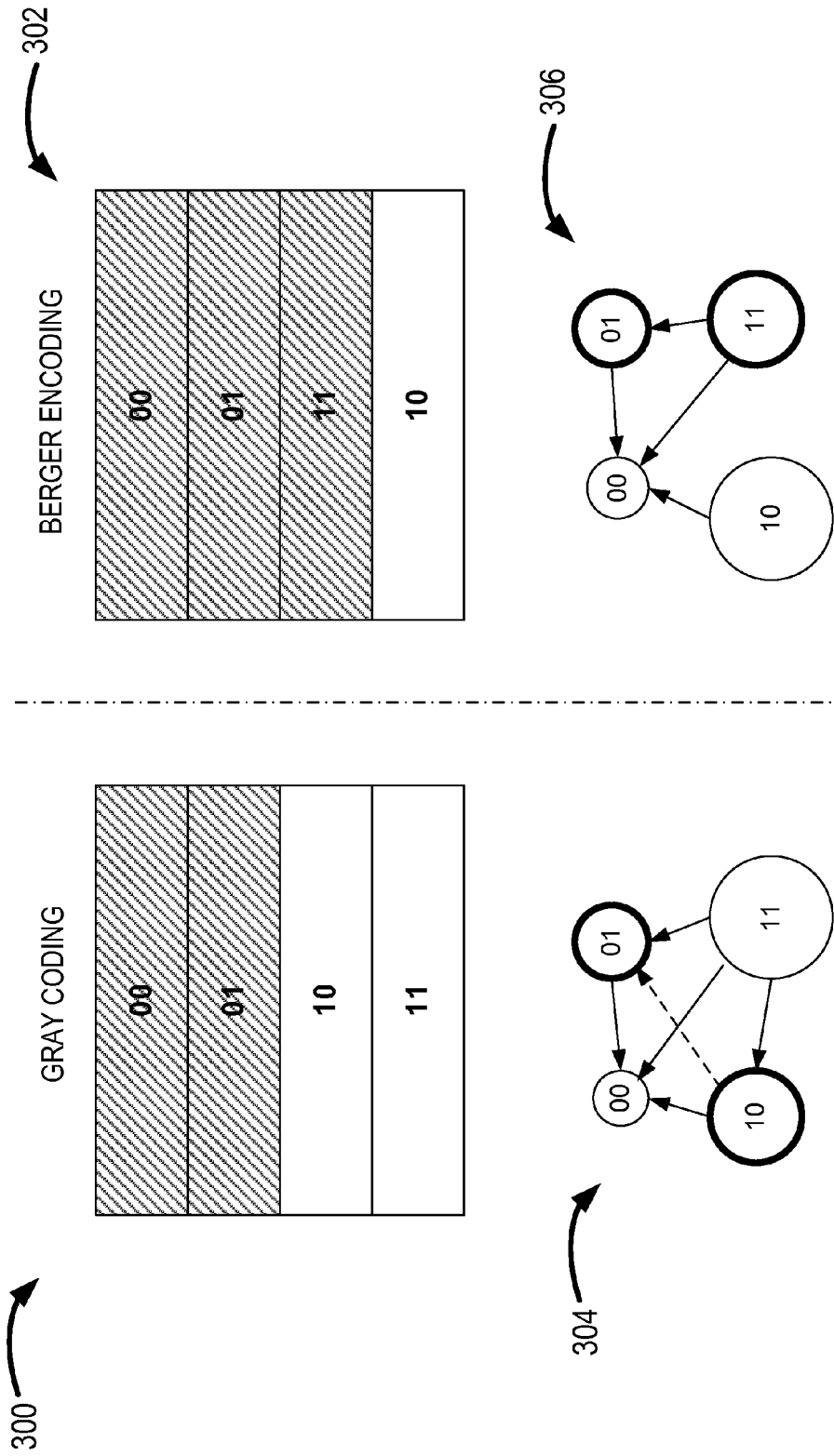
FIG. 3 is an illustration comparing error detection of a 4-level PRAM cell that uses Gray encoding with a 4-level PRAM cell that is encoded using Berger Code-compatible encoding.

FIG. 3 is an illustration comparing error detection of a 4-level PRAM cell 300 that uses a binary encoding scheme with a 4-level PRAM cell 302 that is encoded using Berger Code-compatible encoding arranged according to at least some embodiments presented herein. Unidirectional errors may be detected when a level of a PRAM cell undergoes resistance drift. When the resistance of the level is measured (in a read operation), the encoding representing the particular resistance level may transform, for example, from a logical "1" to a logical "0." Thus, changes in resistance for a particular level may falsely indicate different data than what was actually written.

In FIG. 3, the PRAM cell 300 may be encoded with the binary encoding scheme. The levels in which resistance drift errors can be detected, levels "00" and "01," are indicated by a hatch pattern in the levels. Levels in which resistance drift errors can be detected may also be called "protected levels." The levels in which resistance drift errors may not be detected, levels "11" and "10," do not have a hatch pattern.

The level "11" may not be a protected level because, as described in FIG. 1, the lowest resistance level typically may not experience any appreciable degree of resistance drift. The level "10" may not be a protected level because unidirectional error detection schemes based on regular binary encoding typically may not detect bit transformations from "0" to "1." If the level "10" experiences resistance drift, the second bit from the left would transform from a "0" to a "1," making detection of the resistance drift difficult, if not impossible.

The PRAM cell 302 may be encoded using Berger Code-compatible encoding. Thus, the encoding of the levels progress from the lowest level as "10," to "11" and then to "01," and up to the highest level "00." The protected levels in the PRAM cell 302 are indicated using the hatch pattern. When compared to the PRAM cell 300, it can be seen that the PRAM cell 302 has an additional protected level. One reason is that, by using Berger Code-compatible encoding, resistance drifts in the three protected levels of the PRAM cell 302 may involve a transformation of a bit from a "1" to a "0," which is detectable in the present unidirectional error detection structure. It should be noted that the level "10" of the PRAM cell 302 may also be protected in some embodiments, but as noted above, the lowest resistance level of a MLC PRAM, such as one that would include the PRAM cell 302, may not experience an appreciable amount of resistance drift. Thus, according to some examples, the lowest resistance level generally may be disregarded for the purposes of detecting resistance drift errors.

Graph 304 that is associated with the PRAM cell 300 and graph 306 that is associated with the PRAM cell 302 provide additional details regarding resistance drifts. Each node in the graph 304 or the graph 306 may represent a level of the particular MLC. The levels of the graph 304 or the graph 306 are shown as having different sized circles. In the current example, smaller circles may indicate higher resistance levels relative to the resistance levels indicated by larger circles. The error detection capabilities are shown as arrows with solid lines connecting the levels in the graph 304 or the graph 306. The errors that may not be detected are shown as arrows with dashed lines connecting the levels in the graph 304 or the graph 306. Levels that are most susceptible to resistance drift errors are shown using bold circles.

In an example situation, it may be preferable that the vulnerable levels have arrows pointing to levels that are smaller than it (or higher resistance levels). In the graph 304, it is shown that the level "10" is unprotected. Further, the level that is not considered to be vulnerable to resistance drift, "11," is completely protected. In the graph 306, it is shown that the levels that are most vulnerable, levels "11" and "01," are protected as well as the level "00." Thus, the graph 304 indicates two protected levels, whereas the graph 306 indicates three protected levels. The Berger Code-compatible encoding may also be used for MLCs having more than four levels, as illustrated in FIG. 4.

Figure 4:
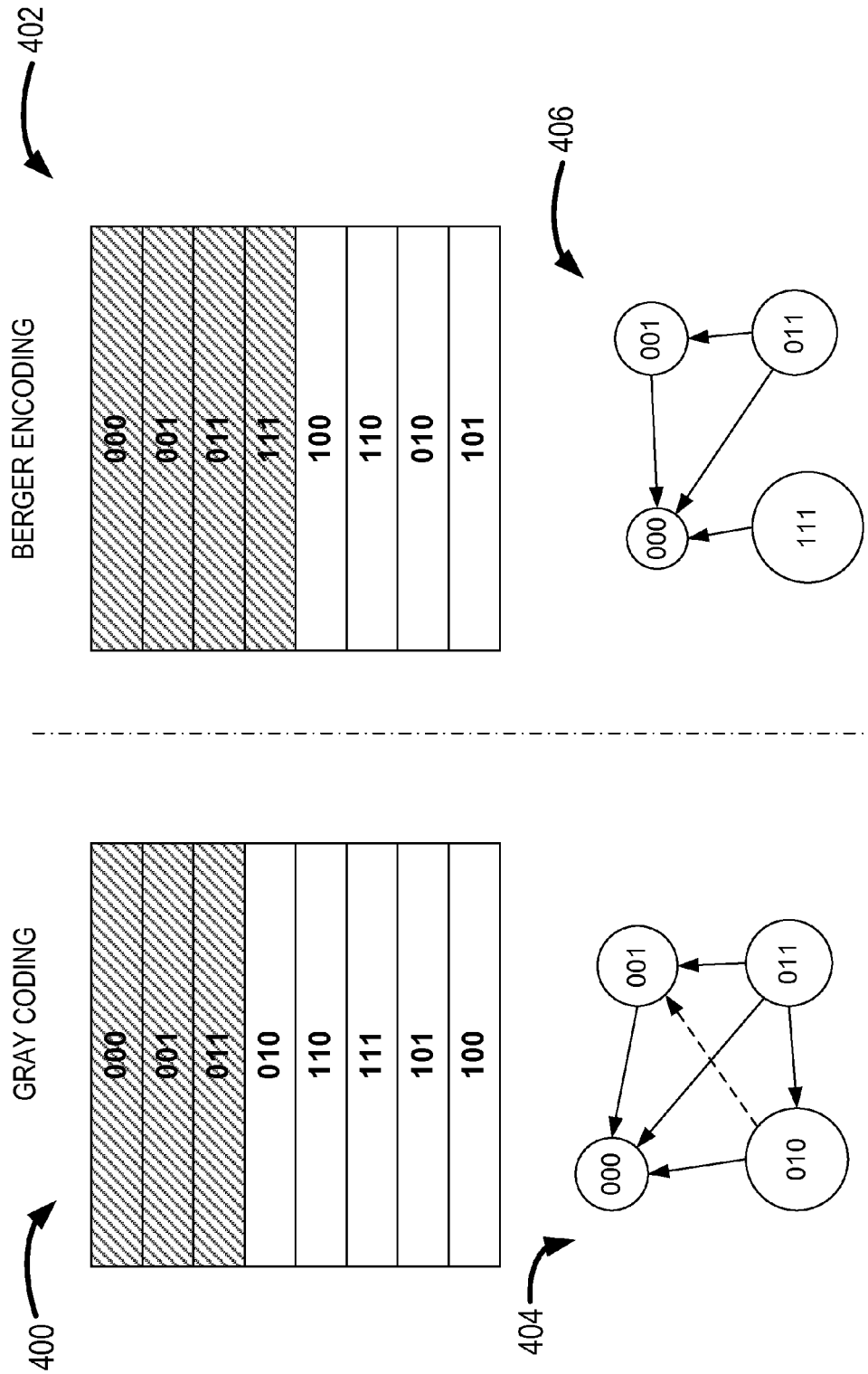
FIG. 4 is an illustration comparing error detection of an 8-level PRAM cell that uses Gray encoding with an 8-level PRAM cell that is encoded using Berger Code-compatible encoding.

FIG. 4 is an illustration comparing error detection of an 8-level PRAM cell 400 that uses Gray encoding with 8-level PRAM cell 402 that is encoded using Berger Code-compatible encoding arranged according to at least some embodiments presented herein. The PRAM cell 400 may use Gray Code, where pairs of adjacent states may differ by just one bit. The PRAM cell 402 may be encoded using Berger Code-compatible encoding. Applying Gray Code to the PRAM cell 400 protects levels, "000," "001," and "011," leaving the remaining levels unprotected, also illustrated in graph 404. Using Berger Code-compatible encoding for the PRAM cell 402 protects four levels, "000," "001," "011," and "111." In the PRAM cell 402, these protected levels are the four highest resistance levels. The protection is also illustrated in graph 406.

Figure 5:
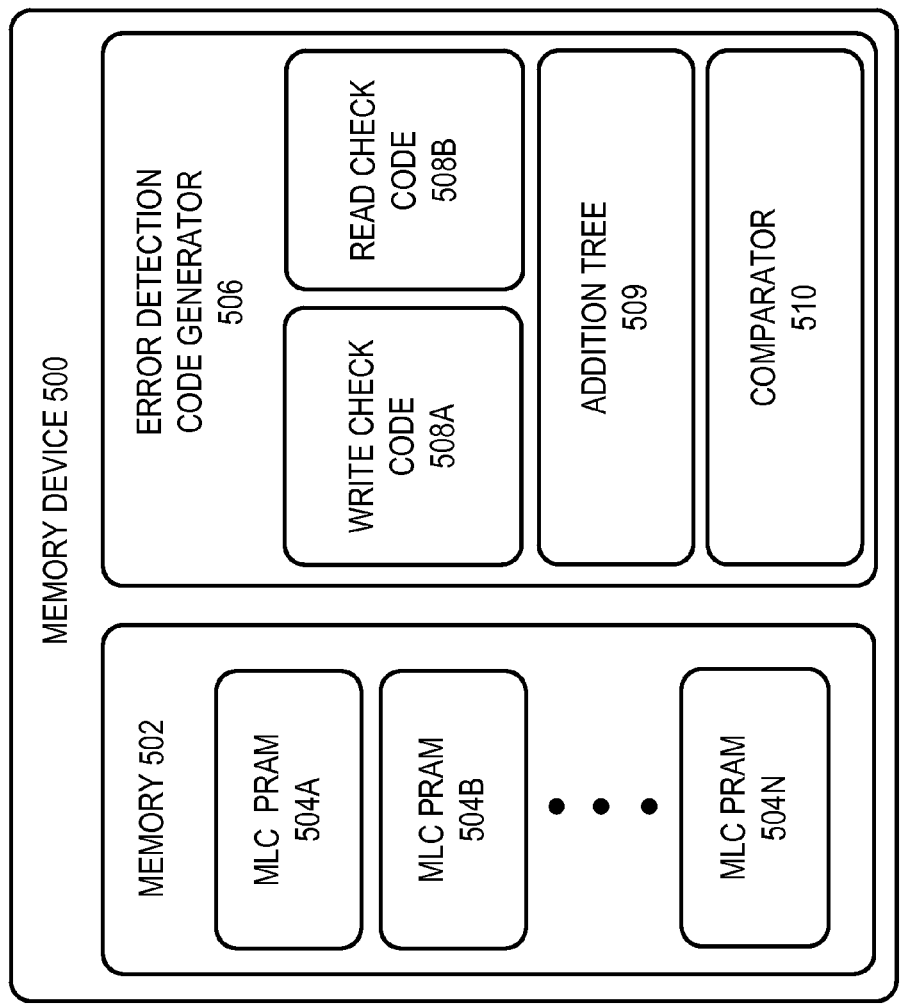
FIG. 5 is a block diagram illustrating an example memory device configured to detect unidirectional errors in a phase change memory.

FIG. 5 is a block diagram illustrating an example memory device 500 configured to detect unidirectional errors in a phase change memory arranged according to at least some embodiments presented herein. The memory device 500, or various components of the memory device 500, may be part of one or more components of a computing device. The various components of the memory device 500 in FIG. 5 are illustrated as a unitary device for descriptive purposes only.

The memory device 500 may include a memory 502. The composition, use and location of the memory 502 may vary from application to application. For example, the memory 502 may be memory associated with a register of a central processing unit, on-die static RAM caches, external caches, dynamic RAM, or other type of memory or storage device (including volatile and non-volatile memory). The memory 502 may include one or more multilevel cell PRAMs (MLC PRAMs) 504A-504N (hereinafter also referred to collectively and generically as the "MLC PRAMs 504"). The MLC PRAMs 504 may each be comprised of an individual cell constructed from phase change materials such as GST materials. The MLC PRAMs 504 may also be used as random access memory in one or more components of a computing device. The MLC PRAMs 504 may be usable in or on various components or systems of a computing device. The presently disclosed subject matter is not limited to any particular implementation or use of the MLC PRAMs 504.

As described above, over a period of time, one or more levels of the MLC PRAMs 504 may experience resistance drift, possibly resulting in an error during a read operation or other operation. Because resistance drift may typically occur in a direction of increasing resistance from a more crystalline state to a less crystalline, or amorphous, state, resistance drift errors can occur in a single direction, or are unidirectional. To detect unidirectional errors of one or more levels of the MLC PRAMs 504, the MLC PRAMs 504 may be encoded using Berger Code-compatible encoding, such as the encoding illustrated in the PRAM cell 302 of FIG. 3 or the PRAM cell 402 of FIG. 4. Other types of unidirectional error detection encoding schemes (e.g., constant-weight codes) may be used and are considered to be within the scope of the presently disclosed subject matter.

The Berger Code-compatible encoding used in the MLC PRAMs 504 may be used by an error detection code generator 506 to generate a write check code 508A and read check code 508B. The error detection code generator 506 may be embodied in hardware, software, or a combination of hardware and software. The error detection code generator 506 may be coupled to the memory 502 and may receive an input that a word has been stored in one of the MLC PRAMs 504. The error detection code generator 506 may be activated to generate the write check code 508A for the word written to one of the MLC PRAMs 504. FIG. 2 provides a description of generating the write check code 508A. As described in FIG. 2, the error detection code generator 506 may receive the word from the MLC PRAMs 504 and may determine the number of zeroes in the word written to one of the MLC PRAMs 504. According to an example, the sum of zeroes may be stored as the write check code 508A in binary form.

The error detection code generator 506 may also be activated when a word is read from one of the MLC PRAMs 504. The error detection code generator 506 may receive the word as read from the MLC PRAMs 504 and may determine the number of zeroes in the word when read from the MLC PRAMs 504. The sum of the zeroes may be stored as the read check code 508B. The write check code 508A and/or the read check code 508B may be stored in the memory 502 or may be stored in other storage component(s) not illustrated in FIG. 5. In some examples, the write check code 508A may be stored when the word is written to one of the MLC PRAMs 504. The presently disclosed subject matter is not limited to any particular manner in which the write check code 508A and/or the read check code 508B is stored.

The error detection code generator 506 may include or be otherwise coupled to an addition tree 509. The addition tree 509 may be operative to calculate a number of logic 0 bits for the word written to one of the MLC PRAMs 504 or the word as read from one of the MLC PRAMs 504. The error detection code generator 506 may receive the output from the addition tree 509 and may convert the output to a binary representation, which may be stored as the write check code 508A or the read check code 508B as applicable.

The write check code 508A may be compared to the read check code 508B by a comparator 510 included in or otherwise coupled to the error detection code generator 506 and/or to the addition tree 509. This comparison may be used in attempt to determine if a unidirectional error has occurred between the time that the word was written to one of the MLC PRAMs 504 and the time that the word is read from one of the MLC PRAMs 504. If the write check code 508A is different from the read check code 508B, as indicated by an output of the comparator 510, the error detection code generator 506 may provide an output to indicate that an error is present.

The error detection code generator 506 may also detect unidirectional errors by detecting changes in the word itself. For example, a copy of the word written to one of the MLC PRAMs 504 may be stored in another one of the MLC PRAMs 504 or another area of the memory 502. When a word is read from one of the MLC PRAMs 504, the comparator 510 may retrieve the stored copy of the word and compare the retrieved copy of the word to the word as read from one of the MLC PRAMs 504. The error detection code generator 506 may provide an output to indicate that an error is present, if the copy is different from the word as read from one of the MLC PRAMs 504.

Figure 6:
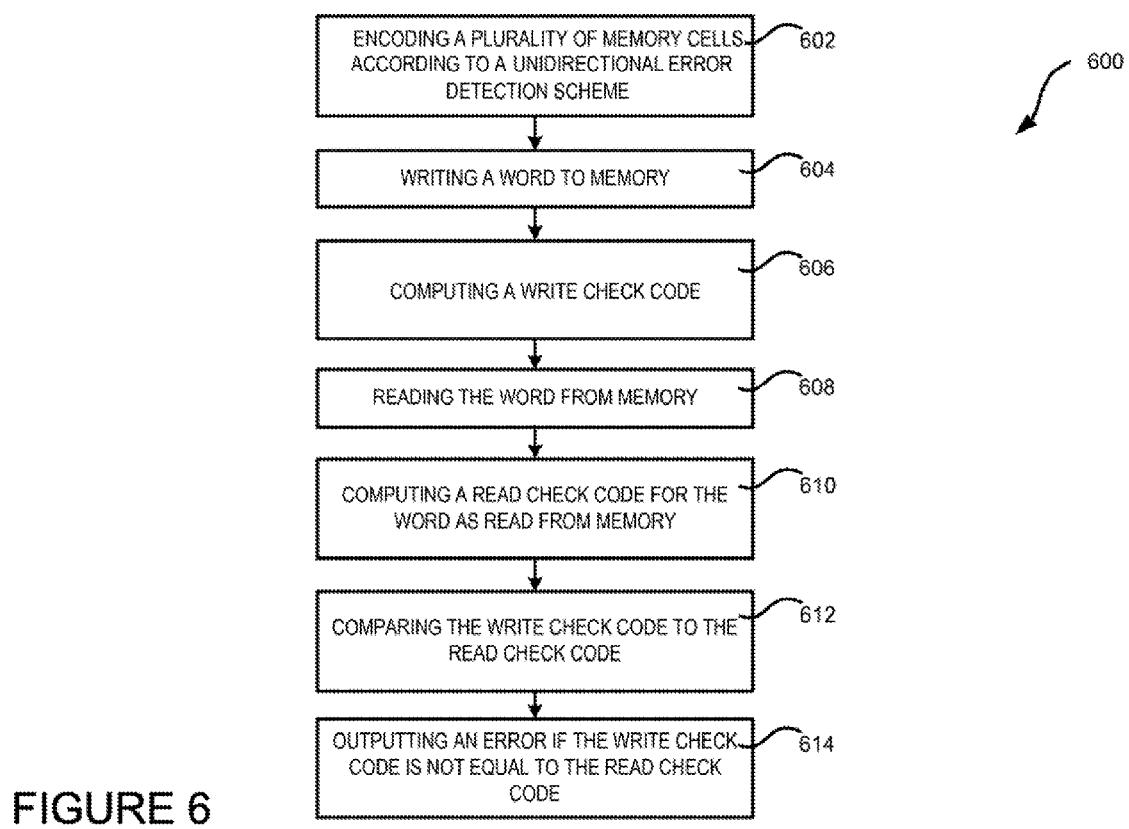
FIG. 6 is a flow diagram illustrating an example process to detect unidirectional errors in a phase change memory.

FIG. 6 is a flow diagram illustrating an example process 600 to detect unidirectional errors in a phase change memory, in accordance with at least some embodiments described herein. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated processes can be ended at any time and need not be performed in its entirety. Some or all operations of the processes, and/or substantially equivalent operations, can be performed by execution of computer-readable instructions included on a computer storage media, as defined herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or other configurations and devices. For purposes of illustrating and describing the features of the various embodiments, the process 600 is described as being performed, at least in part, by the memory device 500. This embodiment is illustrative, and the process 600 may be performed in other ways.

The process 600 may begin at operation 602 ("encoding a plurality of memory cells according to a unidirectional error detection scheme"), where one or more of the MLC PRAMs 504 are encoded according to a unidirectional error detection scheme. For example, the PRAM cell 302 may be encoded by a memory controller, such as the memory controller 715 of FIG. 7, with Berger Code-compatible encoding, with resistance levels encoded from low to high in the order of: 10, 11, 01, to 00, for example. The PRAM cell 402 provides another example of a multilevel memory cell encoded according to a unidirectional error detection scheme, with resistance levels encoded from low to high in the order of: 101, 010, 110, 100, 111, 011, 001, to 000, for example.

Figure 7:
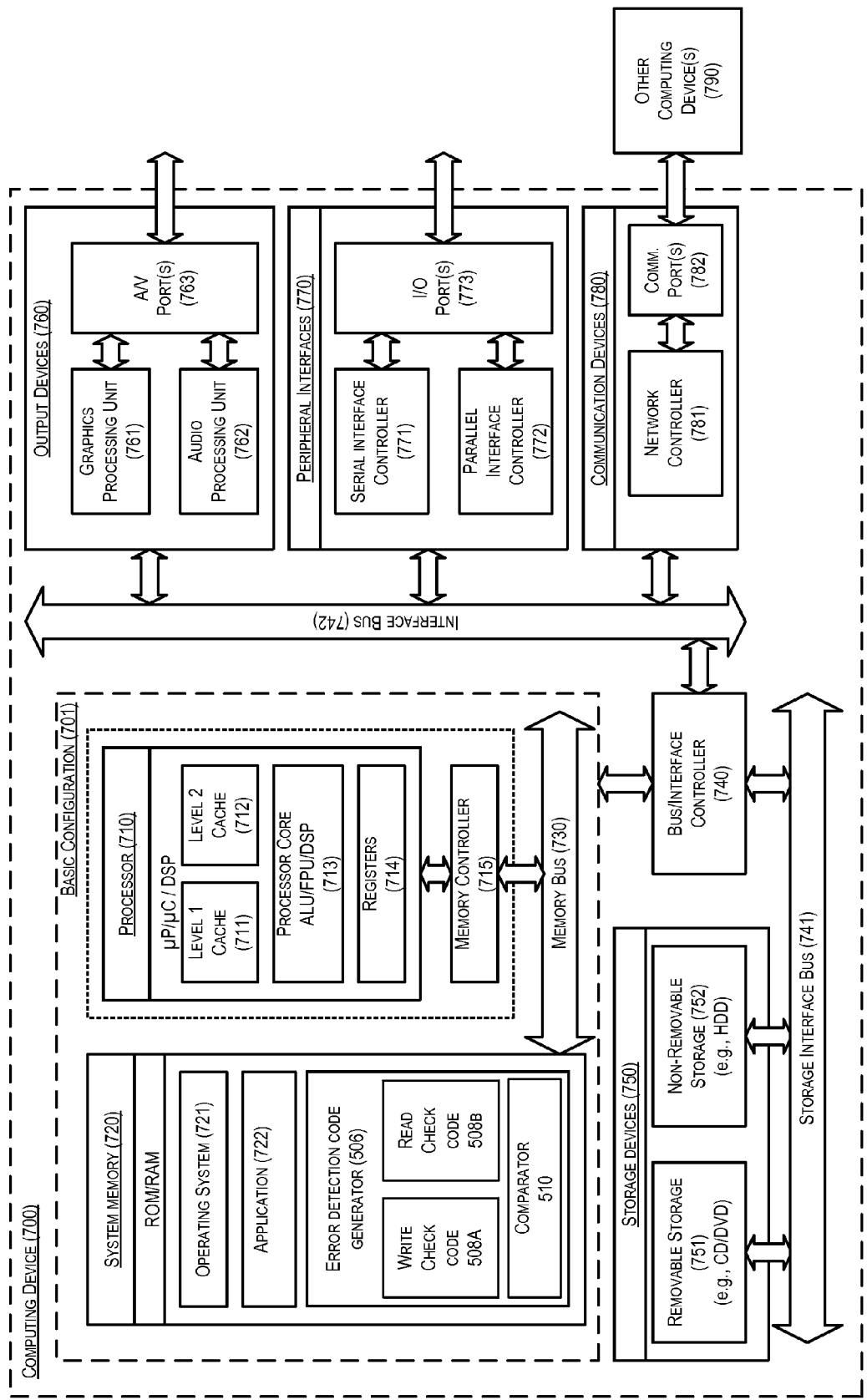
FIG. 7 is a block diagram illustrating an example computing device that is arranged to implement technologies to detect unidirectional errors in phase change memory, all arranged according to at least some embodiments presented herein.

The process 600 may continue to operation 604 ("writing a word to memory"), where a word may be written by a memory controller, such as the memory controller 715 of FIG. 7, to one of the MLC PRAMs 504. The MLC PRAMs 504 may be random access memory associated with a register of a central processing unit, on-die static RAM caches, external caches, dynamic RAM, or other types of memory or storage device.

The process 600 may continue to operation 606 ("computing a write check code"), where the write check code 508A may be computed by the error detection code generator 506 for the word as written to one of the MLC PRAMs 504. The write check code 508A may be a binary representation of the number of zeroes contained in the word written to one of the MLC PRAMs 504.

The process 600 may continue to operation 608 ("reading the word from memory"), where the word written to one of the MLC PRAMs 504 may be read by a memory controller, such as the memory controller 715 of FIG. 7, from the one of the MLC PRAMs 504.

The process 600 may continue to operation 610 ("computing a read check code for the word as read from memory"), where the read check code 508B may be computed by the error detection code generator 506 for the word as read from one of the MLC PRAMs 504. The read check code 508B may be a binary representation of the number of zeroes contained in the word as read from one of the MLC PRAMs 504

The process 600 may continue to operation 612 ("comparing the write check code to the read check code"), where the write check code 508A of the word as written to one of the MLC PRAMs 504 may be compared to the read check code 508B of the word as read from the one of the MLC PRAMs 504. In some examples, a comparator 510 of an error detection code generator 506 may perform the comparison.

The process 600 may continue to operation 614 ("outputting an error if the write check code is not equal to the read check code"), where the error detection code generator 506 may output an indication of an error if the write check code 508A of the word as written to one of the MLC PRAMs 504 is not equal to the read check code 508B of the word as read from the one of the MLC PRAMs 504. The process may thereafter end or repeat for additional words, memory cells, etc.

FIG. 7 is a block diagram illustrating an example computing device 700 that is arranged to implement technologies to detect unidirectional errors in phase change memory arranged in accordance with at least some embodiments described herein. In a very basic configuration 701, computing device 700 typically includes one or more processors 710 and system memory 720. A memory bus 730 can be used for communicating between the processor 710 and the system memory 720. In some examples, the processor 710 may be a single core or multi-core central processing unit ("CPU"). In other examples, the processor 710 may be an array processor or vector processor with two or more parallel computing elements.

Depending on the desired configuration, processor 710 can be of any type including but not limited to a microprocessor ("µP"), a microcontroller ("µC"), a digital signal processor ("DSP"), or any combination thereof. Processor 710 can include one more levels of caching, such as a level one cache 711 and a level two cache 712, a processor core 713, and registers 714. The processor core 713 can include an arithmetic logic unit ("ALU"), a floating point unit ("FPU"), a digital signal processing core ("DSP Core"), or any combination thereof. The memory controller 715 can also be used with the processor 710, or in some implementations the memory controller 715 can be an internal part of the processor 710. The processor 710 can be a multi-core processor having two or more independent processing units ("cores").

Depending on the desired configuration, the system memory 720 can be of any type including but not limited to volatile memory (such as RAM), non-volatile memory (such as ROM, flash memory, etc.) or any combination thereof. One or more components of the system memory 720 (and/or other storage device included in or otherwise coupled to computing device 700) may be comprised of multilevel cells formed from GST material, providing a phase change memory. System memory 720 typically includes an operating system 721 and an application 722, and may include or be coupled to an error detection code generator 506. The error detection code generator 506 may provide the write check code 508A and the read check code 508B. The error detection code generator 506 may also include the comparator 510 to compare the write check code 508A to the read check code 508B. The error detection code generator 506, the write check code 508A, and the read check code 508B, as well as other components or functions described herein, may be associated with other components or functions of the computing device.

Computing device 700 can have additional features or functionality, and additional interfaces to facilitate communications between the basic configuration 701 and any required devices and interfaces. For example, a bus/interface controller 740 can be used to facilitate communications between the basic configuration 701 and one or more data storage devices 750 via a storage interface bus 741. The data storage devices 750 can be removable storage devices 751, non-removable storage devices 752, or a combination thereof. Examples of removable storage and non-removable storage devices include magnetic disk devices such as flexible disk drives and hard-disk drives ("HDDs"), optical disk drives such as compact disk ("CD") drives or digital versatile disk ("DVD") drives, solid state drives ("SSDs"), and tape drives to name a few. Example computer storage media can include volatile and nonvolatile, removable and non-removable media implemented in any method or technology for storage of information, such as computer readable instructions, data structures, program modules, or other data.

System memory 720, removable storage devices 751 and non-removable storage devices 752 are all examples of computer storage media. Computer storage media includes, but is not limited to, RAM, ROM, EEPROM, flash memory or other memory technology, CD-ROM, digital versatile disks ("DVDs") or other optical storage, magnetic cassettes, magnetic tape, magnetic disk storage or other magnetic storage devices, or any other medium which can be used to store the desired information and which can be accessed by computing device 700. Any such computer storage media can be part of the computing device 700.

Computing device 700 can also include an interface bus 742 for facilitating communication from various interface devices (e.g., output interfaces, peripheral interfaces, and communication interfaces) to the basic configuration 701 via the bus/interface controller 740. Example output devices 760 include a graphics processing unit 761 and an audio processing unit 762, which can be configured to communicate to various external devices such as a display or speakers via one or more A/V ports 763. Example peripheral interfaces 770 include a serial interface controller 771 or a parallel interface controller 772, which can be configured to communicate with external devices such as input devices (e.g., keyboard, mouse, pen, voice input device, touch input device, etc.) or other peripheral devices (e.g., printer, scanner, etc.) via one or more I/O ports 773. An example communication device 780 includes a network controller 781, which can be arranged to facilitate communications with one or more other computing devices 790 over a network communication via one or more communication ports 782. The communication connection is one example of a communication media.

Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency ("RF"), infrared ("IR"), Fiber Optics, and other wireless media. The term computer readable media as used herein can include both storage media and communication media.

Computing device 700 can be implemented as a portion of a small-form factor portable (or "mobile") electronic device such as a cell phone, a personal data assistant ("PDA"), a personal media player device, a wireless web-watch device, a personal headset device, an application specific device, or a hybrid device that include any of the above functions. Computing device 700 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. This disclosure is not limited to particular methods, compounds, or compositions, which can, of course, vary. The terminology used herein is for the purpose of describing particular embodiments only, and is not intended to be limiting.

Other memory access technologies and techniques may be used and are still considered to be within the scope of the present disclosure. Additionally, for purposes of clarity, one or more components of the circuits in the figures may not be illustrated but may be included. The circuits illustrated are not limited to the components illustrated and may include more or fewer components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitation unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to detect unidirectional errors in a phase change memory, the method comprising:
   encoding a plurality of multilevel memory cells in a memory according to a unidirectional error detection encoding scheme, wherein the unidirectional error detection encoding scheme is operative to provide an indication of resistance drift of a state of at least one of the plurality of multilevel memory cells of the memory, and the resistance drift comprises a change in resistance from a lower resistance level to a higher resistance level;
   writing a word to the memory;
   computing a write check code for the word as written to the memory;
   storing the write check code in the memory;
   reading the word from the memory;
   computing a read check code for the word as read from the memory;
   comparing the write check code computed for the word as written to the memory to the read check code computed for the word as read from the memory; and
   outputting an error indication if the write check code is not equal to the read check code computed for the word as read from the memory.

2. The method of claim 1, wherein the unidirectional error detection encoding scheme comprises Berger Code-compatible encoding.

3. The method of claim 1, wherein computing the write check code for the word as written to the memory comprises adding a number of logic 0 bits in the word as written to the memory.

4. The method of claim 3, wherein computing the read check code for the word as read from the memory comprises adding a number of logic 0 bits in the word as read from the memory.

5. The method of claim 4, wherein the write check code computed for the word as written to the memory and the read check code computed for the word as read from the memory comprise a binary representation of the number of logic 0 bits in the word.

6. A non-transitory computer-readable storage medium comprising computer-executable instructions stored thereon which, in response to execution by a computer, cause the computer to perform the method of claim 1.

7. A memory device, comprising:
   a plurality of multilevel memory cells encoded according to a unidirectional error detection encoding scheme, wherein the unidirectional error detection encoding scheme is operative to provide an indication of resistance drift of a state of at least one of the plurality of multilevel memory cells of the memory, and the resistance drift comprises a change in resistance from a lower resistance level to a higher resistance level;
   an error detection code generator coupled to the plurality of multilevel memory cells and operative to:
      generate a write check code for data as written into at least one of the plurality of multilevel memory cells, and
      generate a read check code for the data as read from the at least one of the plurality of multilevel memory cells; and
   a comparator coupled to the error detection code generator and operative to:
      compare the write check code generated by the error detection code generator to the read check code generated by the error detection code generator, and
      output an error indication if the write check code generated by the error detection code generator and the read check code generated by the error detection code generator are different.

8. The memory device of claim 7, wherein the unidirectional error detection encoding scheme comprises a Berger code compatible scheme.

9. The memory device of claim 7, wherein a highest resistance level of the at least one of the plurality of multilevel memory cells is encoded as a logic 0.

10. The memory device of claim 7, wherein the error detection code generator comprises an addition tree operative to calculate a number of logic 0 bits for the data written to the at least one of the plurality of multilevel memory cells and for the data as read from the at least one of the plurality of multilevel memory cells.

11. The memory device of claim 10, wherein the write check code generated by the error detection code generator and the read check code generated by the error detection code generator comprise a binary representation of the number of logic 0 bits for the data.

12. The memory device of claim 7, wherein at least a portion of the plurality of multilevel memory cells comprise phase change memory.

13. A system, comprising:
a bus;
a central processing unit coupled to the bus; and
a memory controller coupled to the bus, the memory controller operative to control an error detection code generator, the error detection code generator configured to:
receive an input from the central processing unit via the bus that a word has been written to a multilevel cell of a phase change memory, wherein the phase change memory is encoded in Berger Code-compatible scheme, wherein the Berger Code-compatible scheme is operative to provide an indication of resistance drift of a state of at least one of the plurality of multilevel memory cells of the memory, and the resistance drift comprises a change in resistance from a lower resistance level to a higher resistance level,
compute a write check code for the word as written to the multilevel cell of the phase change memory,
receive an input from the central processing unit via the bus that the word has been read from the multilevel cell of the phase change memory,
compute a read check code for the word as read from the multilevel cell of the phase change memory,
compare the write check code to the read check code, and
based on a result of the comparison, output an error indication if the write check code is different from the read check code.

14. The system of claim 13, wherein a highest resistance level of the multilevel cell of the phase change memory is encoded as a logic 0.

15. The system of claim 13, wherein the error detection code generator comprises an addition tree operative to calculate a number of logic 0 bits for the word written to the multilevel cell of the phase change memory and for the word as read from the multilevel cell of the phase change memory.

* * * * *